United States Patent [19]

Pirez

[11] Patent Number: 5,041,799

[45] Date of Patent: Aug. 20, 1991

[54] TEMPERATURE COMPENSATION CIRCUIT FOR A CRYSTAL OSCILLATOR

[75] Inventor: Yolanda M. Pirez, Maimi, Fla.

[73] Assignee: Motorola, Inc., Schaumburg, Ill.

[21] Appl. No.: 609,487

[22] Filed: Nov. 5, 1990

[51] Int. Cl.[5] .......... H03B 5/32; H03L 1/02

[52] U.S. Cl. .......... 331/44; 331/158; 331/176

[58] Field of Search .......... 331/44, 66, 158, 176

[56] References Cited

U.S. PATENT DOCUMENTS

| | | | |
|---|---|---|---|
| 3,970,818 | 7/1976 | Friedrichs | 219/210 |
| 3,978,650 | 9/1976 | Hashimoto et al. | 331/176 |
| 4,004,133 | 1/1977 | Hannan et al. | 235/61.7 B |
| 4,430,596 | 2/1984 | Shanley | 310/348 |
| 4,746,879 | 5/1988 | Ma et al. | 331/176 X |
| 4,949,055 | 8/1990 | Leitl | 331/176 X |

FOREIGN PATENT DOCUMENTS

| | | | |
|---|---|---|---|
| 63-275210 | 11/1988 | Japan | 331/176 |

*Primary Examiner*—Siegfried H. Grimm

*Attorney, Agent, or Firm*—Robert S. Babayi

[57] ABSTRACT

A crystal reference frequency is characterized by determining the compensation signal variations of a compensation signal over temperature for corresponding signal characterization words. The frequency shift variations of the crystal over temperature are determined and the temperature at which the inflection point of the crystal occurs is found. An inflection point characterization word is found which matches the temperature at which the inflection point of the crystal occurs to the temperature at which the inflection point of the compensation signal occurs. The frequency variations of the crystal are correlated to the compensation signal variations and a signal characterization word is selected which substantially minimizes the frequency variations of the crystal over temperature.

12 Claims, 6 Drawing Sheets

TEMPERATURE COMPENSATION CIRCUIT FOR A CRYSTAL OSCILLATOR

TECHNICAL FIELD

This invention relates generally to oscillators, and is particularly directed toward a frequency oscillator which includes a temperature compensation circuit for its reference frequency crystal.

BACKGROUND ART

It is known that the resonant frequency of crystal reference elements varies over temperature. FIG. 1*a* illustrates the resonant frequency variation of an AT-cut crystal (expressed in parts per million (PPM)) over temperature. Those skilled in the art will appreciate that the crystal performance curve illustrated in FIG. 1*a* may be expressed mathematically by the following equation:

$$f(T)=fo+a_1(T-To)+a_2(T-To)^2+a_3(T-To)^3$$

where

- T is the temperature
- f(T) is the resonant frequency of the crystal at temperature T, and
- fo is the resonant frequency of the crystal at temperature To. As can be seen, the performance over a temperature range of −5° C. to 60° C. is substantially linear, and is centered around an inflection point To at 25° C.

As is known, the first, second and third order coefficients $a_1$, $a_2$, and $a_3$ of equation (1) vary such that each crystal must be separately characterized to determine its performance over temperature. The effect of variations of the first order coefficient $a_1$ causes the curve of FIG. 1*a* to be rotated about the center point To. Accordingly, it is customary to sort or "grade" crystals into one or more groups having different operational ranges over temperature based on variations of the first order coefficient $a_1$. One such selection is illustrated in FIG. 1*b*. As can be seen, the variations of the first order coefficient of equation 1 have been separated into three groups: 5–10 PPM; 10–15 PPM; and 15–20 PPM, each group having 5 PPM range.

When designing an oscillator circuit, it is customary to include a compensation circuit which maintains a constant oscillator output frequency within a specified temperature range. In a manufacturing environment, the compensation circuit must be manually adjusted (or optimized) depending upon the "grading" of the crystal element. This practice is both laborious and highly susceptible to human error. Improper adjustments to the compensation circuit due to errors in crystal grading process or in the optimization of the compensation circuit may lead to erratic or degraded output frequency stability of the oscillator circuit as the ambient temperature varies.

Additionally, this technique does not account for variations caused by the second and/or the third order temperature coefficients $a_2$ and $a_3$, the effects of which may be significant in hot or cold temperature regions (i.e., below −10° C. and above +65° C.).

Accordingly, a need exists for a crystal compensation process that is immune to the human errors typified by current manufacturing processes and covers a wider temperature compensation range.

SUMMARY OF THE INVENTION

Briefly, according to the invention, a method for selecting a characterization word for a crystal is disclosed, wherein the crystal is compensated by a compensation signal generated by a compensation circuit. The compensation circuit is capable of being characterized by characterization signals which represent a compensation characterization word. The compensation signal varies with temperature within a linear, cold and hot region and includes an inflection point which occurs at a temperature within the linear region. The compensation characterization word is determined for each crystal in a characterization process and comprises a signal characterization word and an inflection point characterization word. The inflection point characterization word is used for varying the temperature at which the inflection point occurs. The signal characterization word characterizes the variations of temperature within the linear, cold and hot regions. The crystal is characterized by determining the variations of the compensation signal over temperature at corresponding characterization words. The variations of the crysal frequency over temperature is characterized and the temperature at which the inflection point of the crystal occurs is determined. An inflection characterization word is selected which matches the temperature at which the inflection point of the compensation signal occurs to the temperature at which the inflection point of the crystal occurs. The frequency variations of the crystal are correlated to the compensation signal variations and a signal characterization word is selected which produces a compensation signal such that the frequency variations of the crystal over temperature are substantially minimized.

DETAILED DESCRIPTION OF THE PREFERRED EMBODIMENT

Figure 1A:
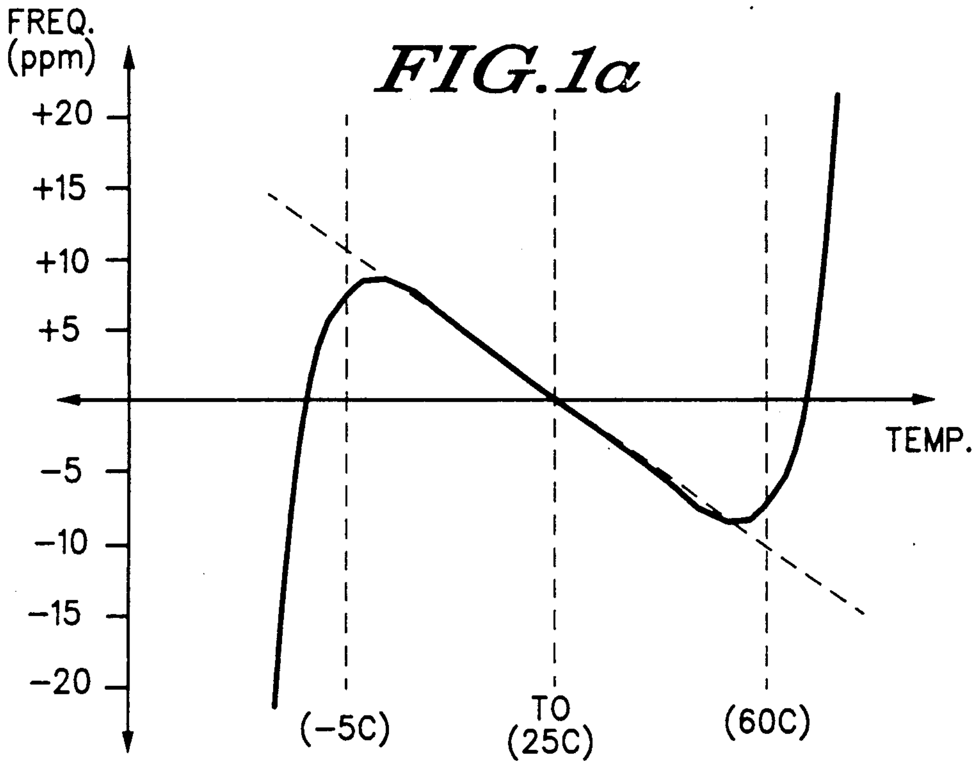
FIG. 1*a* is an illustration of the temperature characteristic of an AT-cut crystal.
Figure 1B:
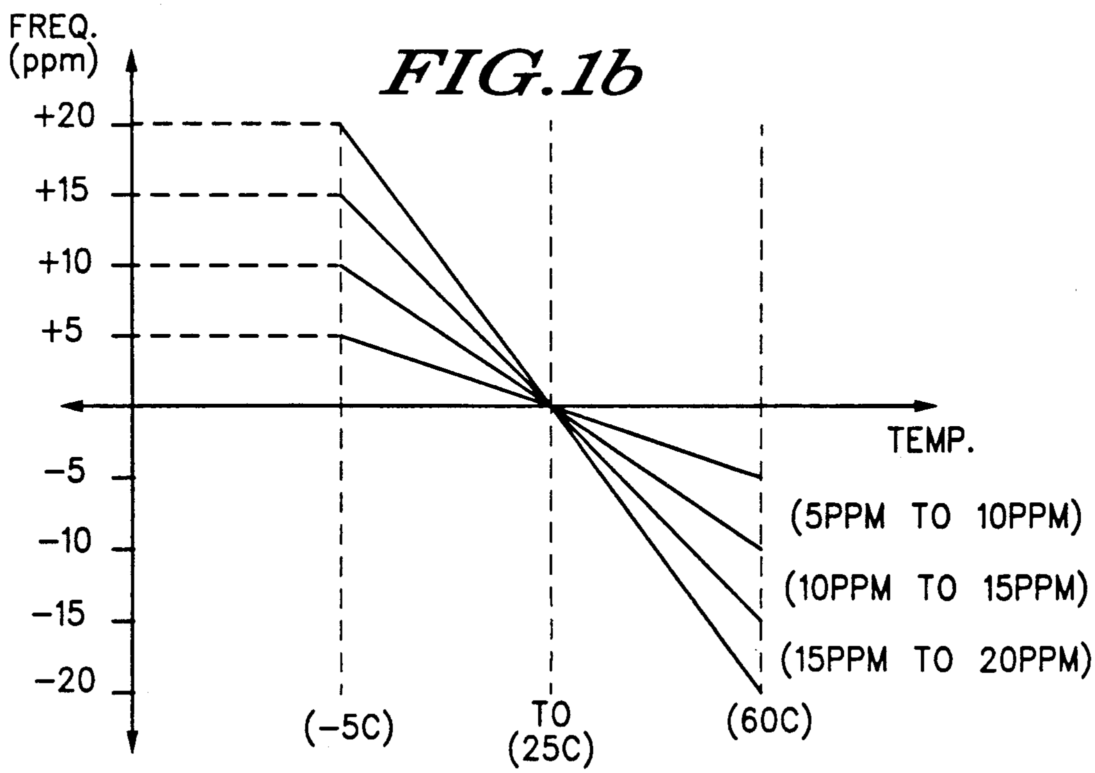
FIG. 1*b* illustrates a typical crystal temperature grading selection.
Figure 2:
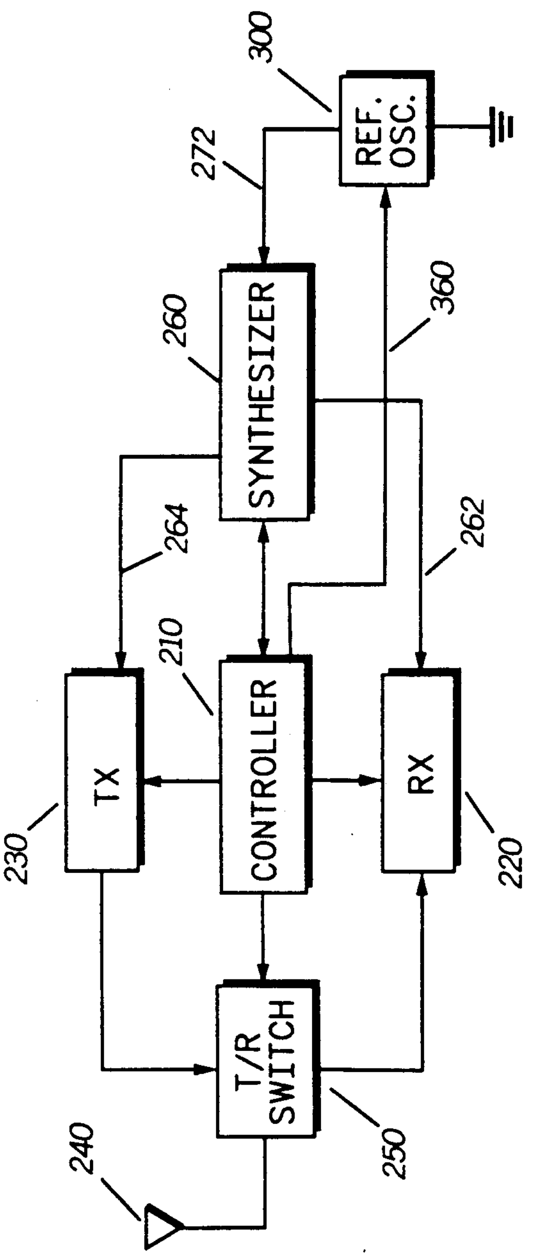
FIG. 2 is a block diagram of a radio which uses the temperature compensation circuit of the present invention.

Referring to FIG. 2, the block diagram of a radio 200 which includes the temperature compensated oscillator circuit of the present invention is shown. The radio 200 comprises a well known frequency synthesized twoway radio which operates under the control of a controller 210. The radio 200 includes a receiver 220 and a transmitter 230 which receive and transmit RF via an antenna 240. The antenna 240 is appropriately switched between the receiver 220 and the transmitter 230 by an antenna switch 250. The radio 200 also includes a well-known phased locked loop synthesizer 260 which under the control of the controller 210 provides a receiver local oscillator signal 262 and a transmitter local oscillator signal 264. A reference oscillator 300 provides a reference oscillator signal 272 for the synthesizer 260. The reference oscillator signal 272 is temperature compensated utilizing the principles of the present invention.

Figure 3:
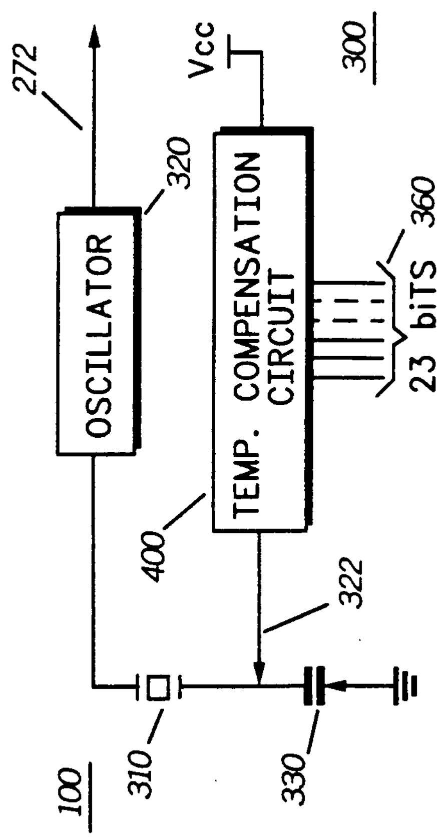
FIG. 3 is a block diagram of a reference oscillator used in the radio of FIG. 1.

Referring to FIG. 3, a block diagram of the oscillator 300 of FIG. 2 is shown. The reference oscillator 300 includes a reference frequency crystal element 310 the output of which is coupled to a well known colpits oscillator 320 to provide the reference oscillator signal 272. The crystal element 310 comprises an AT-cut crystal having a frequency output which is dependent on the angle of cut and the load capacitance. A varactor 330 is coupled to the crystal 310 to vary the load capacitance in order to provide a constant crystal frequency over a predetermined temperature range. The varactor 330 varies the load capacitance in response to an appropriate compensation signal 322 which is generated by a temperature compensation circuit 400. For a given crystal, the temperature compensation circuit 400 must be characterized to generate a compensation voltage which substantially minimizes frequency shifts of the crystal over temperature. The temperature compensation circuit 400 is characterized by characterization signals 360 which comprise binary signals representing a compensation characterization word. As will be described in detail, the compensation characterization word is uniquely generated for each crystal in an off-line crystal characterization operation. In the preferred embodiment of the invention, the characterization word collectively comprises 23 bits of data which are stored in a memory device, i.e., EEPROM (not shown), within the radio 100 and are applied to the temperature compensation circuit 400 by the controller 210 of FIG. 2.

The temperature compensation circuit 400 and the varactor 330 are integrated utilizing well known integrated circuit processes, such as Bipolar, BIMOS, or CMOS technology having a corresponding supply voltage Vcc.

Figure 4:
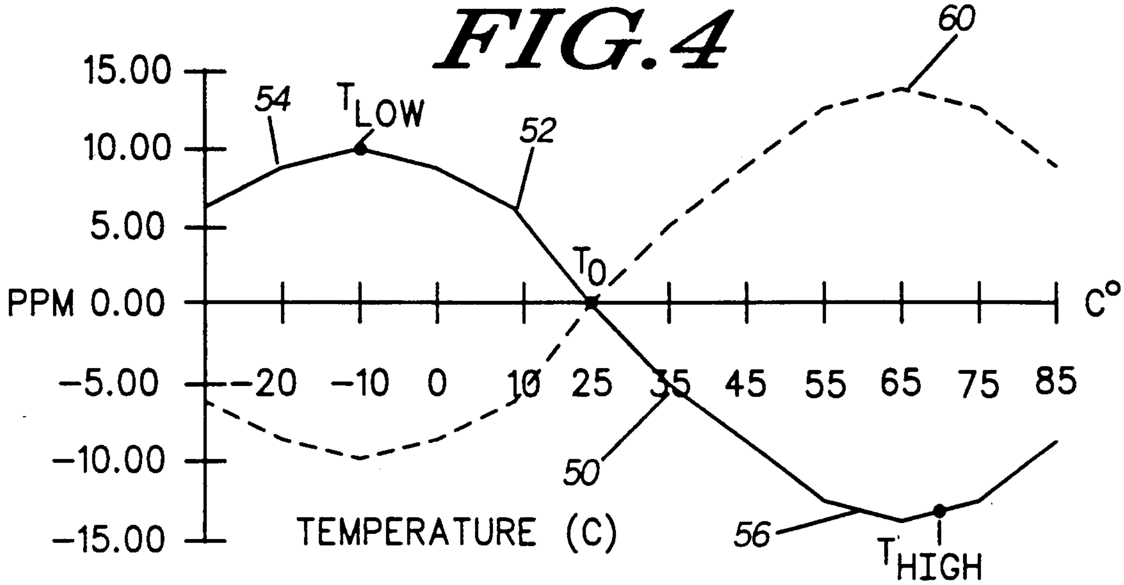
FIG. 4 is the illustration of the crystal frequency variation over temperature and the needed frequency shift to temperature compensate the crystal.

Referring to FIG. 4, the temperature characteristics of a typical AT-cut crystal are shown by the curve 50 as derived from the 3rd order equation (1). The curve 50 is divided into a linear region 52 and two non-linear regions: cold region 54 and hot region 56. The linear region includes an inflection temperature point To at which the crystal has a 0 PPM frequency shift. The cold region 54 includes a cold temperature turning point Tc which comprises the maximum point of the curve 50 and a hot turning point Th which comprises the minimum point of the curve 50. As is well known, the temperature characteristic of each crystal is determined by the coefficients $a_1$, $a_2$, $a_3$ and inflection temperature To. Also shown is a frequency compensation curve 60 which has a symmetrically inverse relationship with the temperature characteristic curve 50. The curve 60 shows the needed frequency shift to provide a substantially zero crystal frequency shift over temperature.

Figure 5:
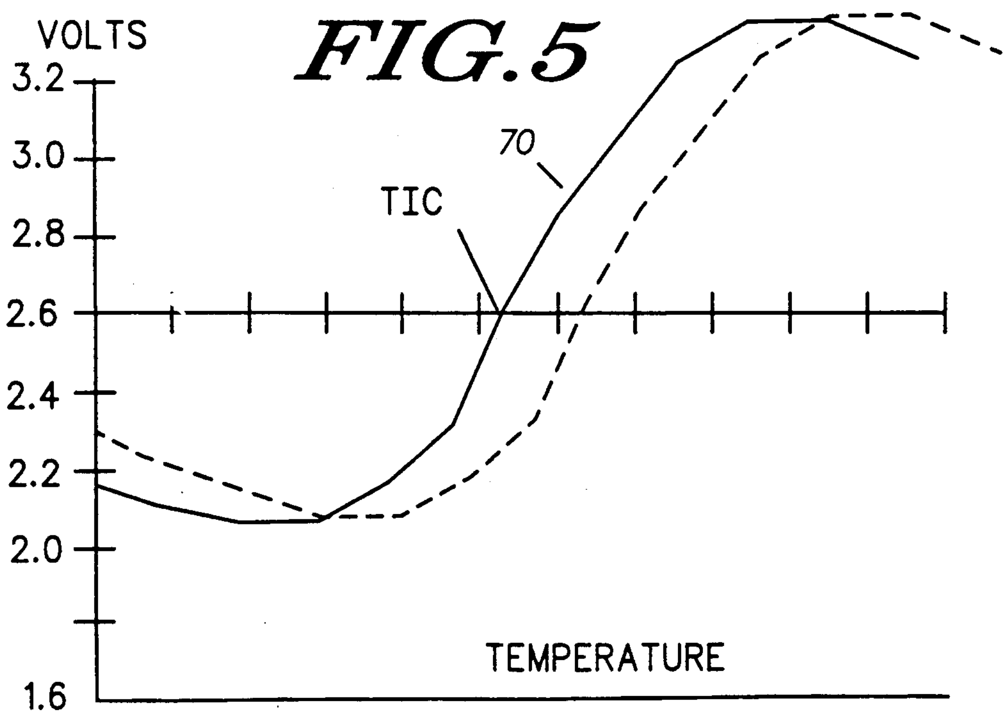
FIG. 5 is the illustration of the variations of a compensation signal over temperature.

Referring to FIG. 5, the variations of the compensation signal over temperature are shown. As shown by curve 70, the compensation signal varies linearly in the middle temperature region and non-linearly in the hot and cold temperature region. It includes a inflection point Tic which occurs at an inflection temperature which must be substantially the same as the inflection temperature of the crystal.

Figure 6:
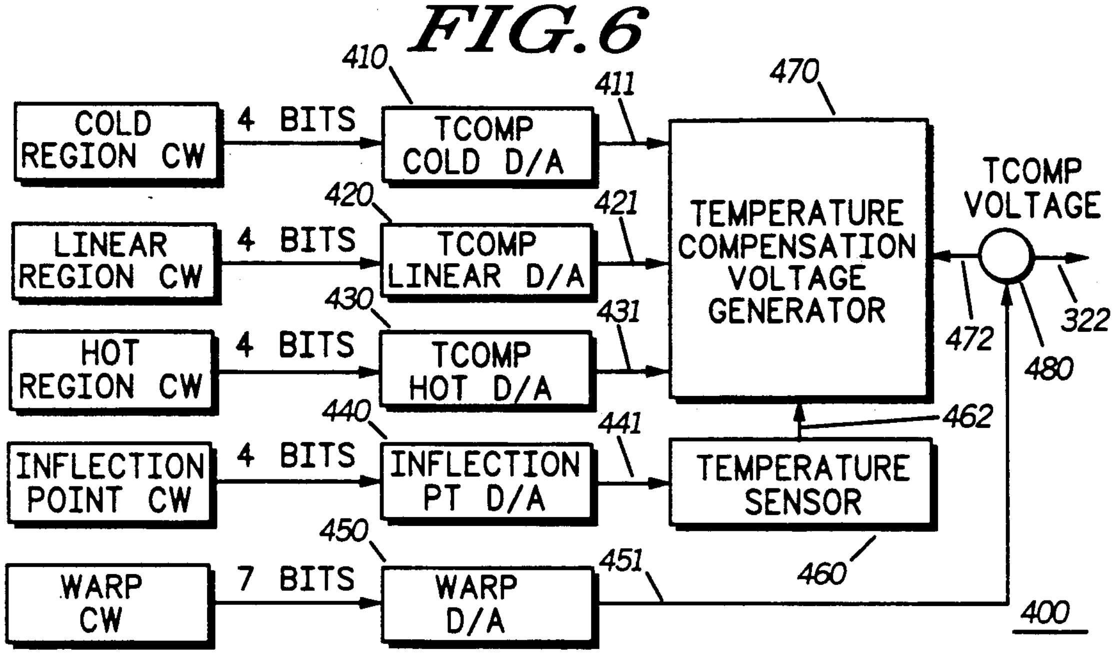
FIG. 6 is a block diagram of a compensation circuit for generating the compensation signal of FIG. 5.

Referring to FIG. 6, the block diagram of the temperature compensation circuit 400 for generating the compensation signal 322 is shown. The binary characterization signals 360 of FIG. 3 represent a 23 bits compensation characterization word (CW) which is divided into a 4 bits linear region CW, a 4 bits cold region CW, a 4 bits hot region CW, a 4 bits inflection point CW, and a 7 bits warp CW. It should be noted that the term "word" as used in this specification generally designates some sets of characterizing bits, i.e., 4 or 7 bits, and does not necessarily refer to an 8 bits data set as referred to in the art. These characterization words are applied to corresponding digital to analog converters 410, 420, 430, 440, and 450 to generate a linear region characterization signal 421, a cold characterization signal 411, a hot characterization signal 431, an inflection point signal 441, and a warp signal 451. As is well known, the signal level of these signals is commensurate with the bit pattern of the characterization words. The linear region characterization signal 421, the cold region characterization signal 411 and the hot region characterization signal 431 characterize the response of the temperature characterization circuit 400 in the linear temperature region and the non-linear cold and hot regions.

The inflection point signal 441 characterizes the temperature at which the inflection point of the compensation signal occurs. As will be described later, variations of the inflection point signal 441 causes the inflection point $T_{ic}$ to be moved along the temperature axis (shown by dashed line in FIG. 5). Correspondingly, inflection point signal 441 adjusts the inflection point To of the frequency compensation curve 60 along the temperature axis such that a symmetrically inverse relationship to between the temperature characteristic curve 50 and the frequency compensation curve is created.

The warp signal 451 sets the nominal frequency of the crystal 310. The warp signal may be represented by 127 combinations, wherein each combination causes predetermined shifts from the nominal frequency of the crystal 310.

The inflection point signal 441 is applied to a temperature sensor 460 which provides a temperature signal 462 corresponding to the ambient temperature. The linear characterization signal 421, the cold characterization signal 411, the hot characterization signal 431, and the temperature signal 462 are applied to a temperature compensation voltage generator 470. The The warp signal 450 is summed with output of the temperature compensation voltage generator 470 in a summer 480 to generate the temperature compensation signal 322.

Figure 7:
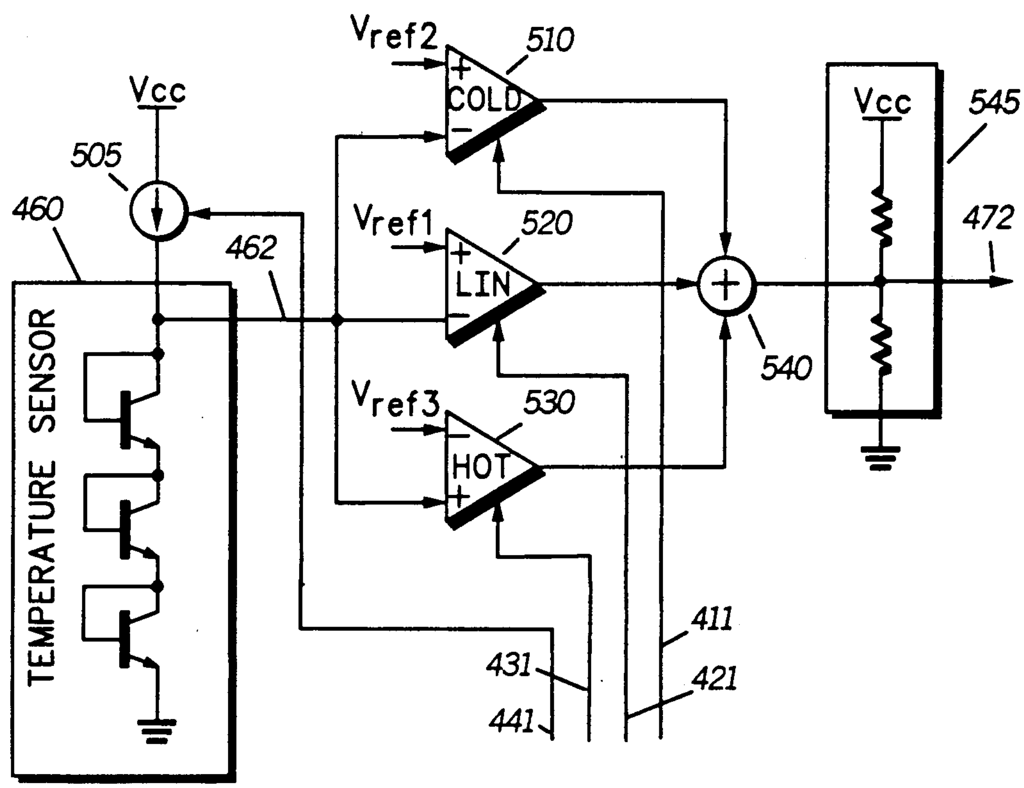
FIG. 7 is the schematic diagram of a compensation signal generator of the compensation circuit of FIG. 6.

Referring to FIG. 7, the schematic diagram of the temperature compensation voltage generator 470 and the temperature sensor 460 is shown. The temperature sensor 460 comprises a well known diode configuration which generates a temperature signal 462 in accordance with the ambient temperature. The temperature signal 462 is simultaneously applied to programmable differential amplifiers 510, 520 and 530, wherein the current through their differential pair (not shown) is controlled by the signal levels of the linear region characterization signal 421, the cold characterization signal 411, and the hot characterization signal 431. The differential amplifier 520 comprises a linear region current generating differential amplifier, the differential amplifier 510 comprises a non-linear cold region current generating differential amplifier, and the differential amplifier 510 comprises a non-linear hot region current generating differential amplifier. The temperature signal 462 is coupled to the input of each differential amplifier to establish a temperature dependent input voltage level. The other inputs of each differential amplifier are coupled to fixed voltage level input Vref 1, Vref 2 and Vref 3. Thus the input to each differential amplifier is a temperature dependent differential voltage. The output current of these current generating differential amplifiers 510, 520 and 530 are summed together by a summer 540. Output 472 of the summer 540 is coupled to a resistive divider network 545 so as to provide an output voltage having a symmetrical dynamic range. The operation of the operational amplifiers 510, 520, and 530 for providing the linear and non-linear characteristic of the compensation signal in response to the temperature signal 462 is fully described in the U.S. Pat. No. 4,254,382 issued to Keller which is hereby incorporated by reference.

According to one aspect of the invention, the current through the temperature sensor 460 may be controlled by the inflection signal 441 via a well known programmable current source 505. The current source 505 is responsive to the level of the inflection point signal 441 to provide a temperature signal level in accordance therewith. Therefore, the temperature signal level may be varied by the inflection point signal 441. The variation of the temperature signal creates a voltage potential across the linear differential amplifier 520 which sets the temperature at which the inflection point of the compensation signal occurs. Therefore, variation of the inflection point signal 441 varies the temperature at which the inflection point Tic of the compensation signal 322 occurs. The matching of the temperatures at which the inflection point of the compensation signal and the crystal occur is one of the key features of the present invention for minimizing the frequency shift of the crystal over temperature. Once an inflection point CW which matches the inflection point Tic of the compensation signal and the inflection point To of the crystal is determined, the linear region, cold region and hot region CWs are determined which produce a compensation signal corresponding to frequency shift variations of the crystal over these temperature regions.

Each crystal is characterized to determine a corresponding compensation CW which produces the characterization signals for providing a compensation signal that substantially minimizes the frequency shift of the crystal over temperature.

Figure 8:
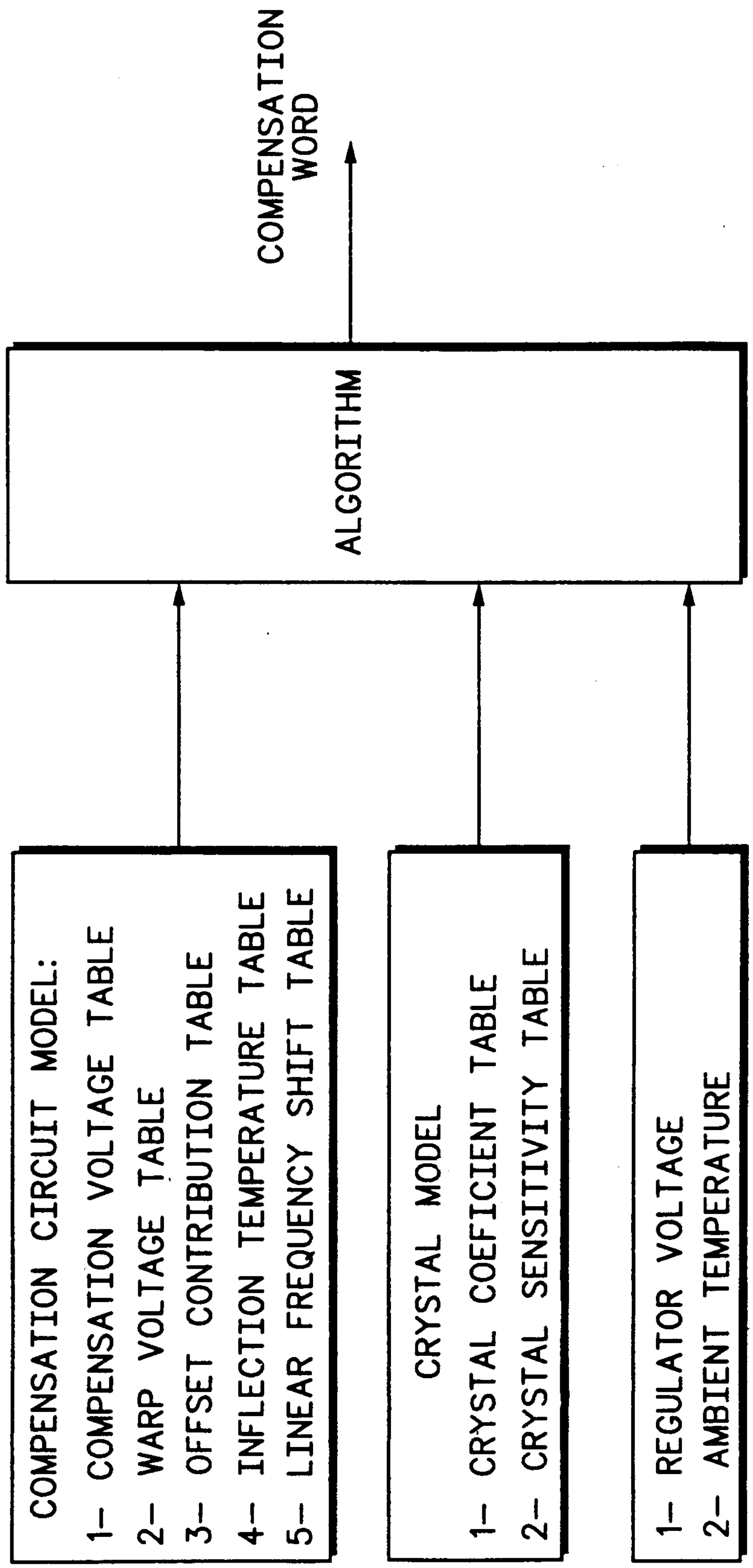
FIG. 8 is the the block diagram of the characterization process of a typical crystal.

Referring to FIG. 8, according to another aspect of the invention the process of characterizing the crystals comprises an off-line operation in which a compensation circuit model, a unique crystal model, measured crystal sensitivity, ambient temperature and supply voltage of the compensation circuit are inputted to a characterization algorithm being executed by a computer for generating the unique compensation CW for each crystal.

The compensation circuit 400 is manufactured utilizing circuit integration techniques which provide minimized process variations, thereby making the characteristics of the compensation signal output of the compensation circuits substantially predictable. Therefore, the compensation circuit model developed for a typical compensation circuit may be assumed to be constant and be applicable to all compensation circuits produced in the same process. Additionally, well simulation techniques allow for prediction of the characteristics of the compensation signals for all possible variations of the characterization signals over temperature.

A model oscillator circuit identical to the oscillator 300 of FIG. 3 is utilized for modelling the frequency response of the compensation circuit 400. The model oscillator utilizes a crystal (as crystal 310) having typical characteristics.

The compensation circuit 400 is modelled by a compensation voltage table, a warp voltage table, offset contribution table, inflection temperature table, and a linear frequency shift table.

The compensation voltage table comprises measured output voltage of the compensation signal as produced by a typical compensation circuit 400 in predetermined temperature intervals for all possible combinations of the compensation of characterization words (which are applied to the compensation circuit 400 by the characterization signals 360). In the preferred embodiment of the invention, the voltage compensation table includes voltage levels measured at different compensation CWs, and at 12 temperature points from 85° C. to −30° C. The compensation voltage table was generated using a nominal supply voltage Vcc, thereby taking into consideration the effects of supply voltage variations over temperature. The compensation voltage table was generated by maintaining the inflection point CW and the warp CW at a constant middle setting, i.e., setting of 8 for inflection CW and setting of 64 for warp CW. Additionally, because the compensation circuit 400's compensation signal has a symmetrical response about the inflection point Tic, the compensation voltage table is reduced by setting both hot and cold region CW's to the same setting to obtain all the possible combinations of the compensation voltages over temperature. Accordingly, 256 compensation voltages are included in the compensation voltage table which may be represented as:

TC[i,j,k]

where:

- i is the index for the linear region CW (Range: 0–15);
- j is the index for the hot and/or cold region CW (Range: 0–15); and
- k is the index for temperature (Range: 0–11)

Figure 9:
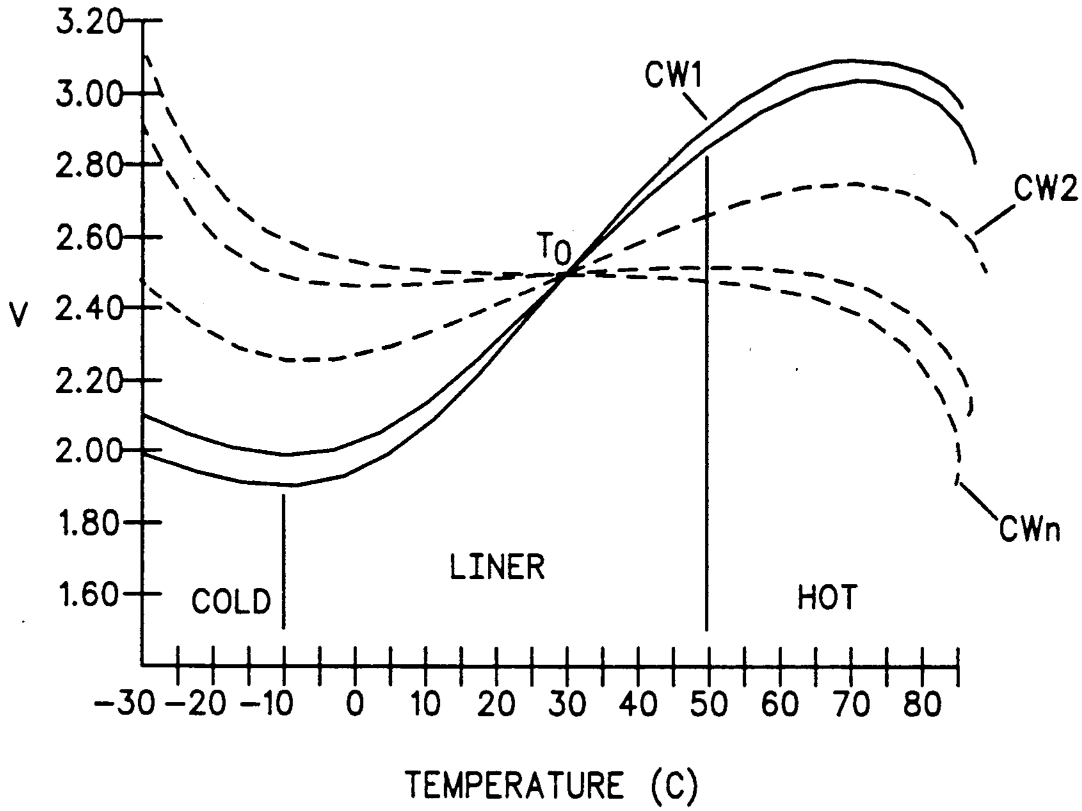
FIG. 9 is the curves of the compensation signals generated by the compensation circuit of FIG. 6.
Figure 10:
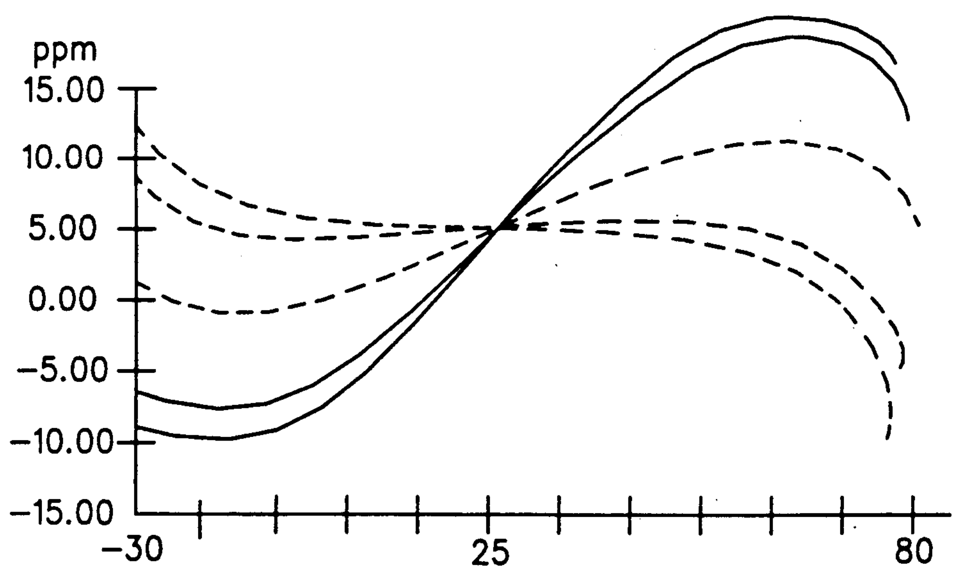
FIG. 10 is the curves of the needed frequency shifts corresponding to the compensation signals of FIG. 9.

Referring to FIG. 9, a plurality of compensation signal curves as represented by the temperature compensation table and generated by the temperature compensation circuit 400 for given compensation CWs (CW1, CW2, . . . , CWn) are shown. The compensation word is divided into the inflection point CW and a signal characterization word which includes in combination the linear region CW, the hot region CW and the cold region CW. As described above, the inflection point CW characterizes the temperature at which the inflection point of the compensation signal occurs. The signal characterization word collectively characterizes the behavior of the compensation signal in the linear, hot, and cold regions. The inflection point CW and the signal CW are each separately determined by the algorithm.

The warp voltage table comprises the warp voltages as produced by the DAC 450 of FIG. 6 for settings of warp CW. This table is referenced to the middle setting of 64 and may be represented by:

Dvwp[p]

where p is the index for the warp CW (Range: 0-64).

The offset contribution table is a table equal to the difference between the computed frequency shift of the model oscillator and the actual measured frequency shift at the temperature intervals. This table is utilized to account for the difference between the measured and computed frequency shifts of crystals and may be represented by:

POSC[t]

where t is the index for temperature (0–11).

The inflection temperature table comprises the predicted temperature of the inflection point for all possible variations of the inflection point CW and is generated by simulating the response of the compensation signal. The inflection point CW at the ambient temperature is also measured utilizing the model oscillator. The measured inflection point CW is determined by balancing the linear region differential amplifier 520 at the ambient temperature. The differential amplifier 520 is balanced by setting the linear region CW to 15 and measuring the frequency of the model oscillator. The setting of the linear region is then modified to 8 and the inflection point CW is stepped through all the 15 possible combinations and the frequency of the oscillator is measured for each step. The inflection point CW providing the minimum frequency difference between the two settings, i.e., 8 and 15, determines the measured inflection point CW setting at ambient temperature. The inflection point CWs of the predicted inflection temperature table are adjusted according to the difference between the measured and the predicted inflection point CW at ambient temperature. Accordingly, the temperature of inflection points of said compensation signal at corresponding inflection points characterization words is determined. The inflection temperature table is represented by:

Tinfl[Tic]

where Tic is the index for inflection point CW.

The linear frequency shift table comprises frequency shift at the turning points in high and low temperatures of the model oscillator for different settings of linear region CW as calculated by utilizing the the sensitivity of the typical crystal of the model oscillator. The linear frequency shift table may be represented by:

LINEARFREQSHIFT[i,l]

where i is the index for linear region CW (0–15) and l is the index for the hot and cold turning points (1 or 2, i.e., 1 for hot and 2 for cold turning points).

Each crystal is uniquely modelled by determining the crystal frequency variations over temperature using the known crystal coefficients a1, a2, and a3 provided by the crystal vendor. These coefficients allow the algorithm to compute the needed frequency shifts over temperature including the needed frequency shifts at the hot turning point Th and the cold turning point Tc. Also determined is the temperature at which the inflection point of the crystal occurs.

The sensitivity of each crystal is measured by determining the frequency shift at 12 discrete warp CW settings. Each of the warp settings corresponds to a voltage as determined by the warp voltage table. The corresponding voltages are curve fitted by the algorithm to determine the crystal sensitivity equation which may be represented by the following mathematical equation.

$$WP[V]=c_0+c_1V+c_2V^2+c_3V^3+\ldots+c_nV^n \quad (2)$$

This equation correlates the frequency shift of the unique crystal to the corresponding voltage levels which may be produced by the compensation circuit 400. Accordingly, the compensation voltage levels of the compensation voltage tables may be converted into corresponding frequency shifts. However, because the frequency shifts due to warp voltages are measured at ambient temperature, during conversion an experimentally measured temperature coefficient is multiplied by the frequency shift to take into account the effects of crystal's motional capacitance and the varactor tolerance variations at corresponding temperatures.

The algorithm selects the inflection point CW from the inflection point table which matches the temperature at which the inflection point of the crystal occurs to the temperature at which the inflection point of the compensation signal occurs. The algorithm selects the warp CW from the warp voltage table which provides a warp voltage which sets the crystal at its nominal frequency. Using the crystal coefficients, the offset contribution table, and the warp voltage table, the algorithm determines the frequency shifts needed at the 12 temperature points. The algorithm then determines the signal characterization word which is the combination of the linear, cold, and hot region CW. The liner region CW is determined by selecting from the linear shift frequency tables the linear region characterization word which provides a minimum frequency error at the hot and cold turning points. Once the linear region CW is selected only 16 more combinations corresponding to the hot and/or cold region CW remain to be selected. The frequency shift errors corresponding to each setting at the corresponding region is determined and the setting which minimizes frequency variations of the crystal over temperature is selected. The hot and cold region CW are set to the selected setting. The linear region, hot, and cold region CW are combined to generate the signal characterization word which in combination with the inflection point CW and the warp CW provide the desired compensation characterization word.

What is claimed is:

1. A method for characterizing a crystal, wherein said crystal is temperature compensated by a temperature compensation circuit capable of generating a compensation signal which varies with temperature according to a signal characterization word, and wherein said compensation signal includes an inflection point which occurs at a temperature according to an inflection point characterization word; said method comprising the steps of:

(a) determining variations of compensation signal over temperature at corresponding signal characterization words;

(b) determining variations of said crystal frequency over temperature;

(c) determining the temperature of inflection points of said compensation signal at corresponding inflection point characterization words;

(d) selecting an inflection point characterization word which substantially matches the temperature at which said inflection point of said compensation signal occurs to the temperature at which the inflection point of said crystal occurs;

(e) correlating crystal frequency variations to compensation signal variations;

(f) selecting a signal characterization word which produces a compensation signal that substantially minimizes frequency variations of said crystal over temperature.

2. The method of claim 1, wherein said crystal is further characterized by the step (g) of determining a warp characterization word which warps said crystal to its nominal frequency output.

3. A circuit for temperature compensating a reference frequency crystal, comprising:

a temperature compensation circuit being responsive to characterization signal levels for generating compensation signals corresponding to said characterization signal levels which vary with temperature and include inflection points occurring at an inflection point temperature; and means responsive to an inflection point characterization signal level for varying the temperature at which said inflection points occur.

4. The circuit of claim 3, wherein said circuit includes a temperature sensor and said inflection point characterization signal level varies the current through said temperature sensor.

5. An oscillator circuit for providing a temperature compensated output signal, comprising:

a reference frequency crystal;

a temperature compensation circuit being responsive to at least one characterization signal for generating a corresponding compensation signal which varies with temperature and includes an inflection point which occurs at an inflection point temperature; and means responsive to an inflection point characterization signal for varying the temperature at which said inflection point of said compensation signal occurs;

a frequency compensation means coupled to said temperature compensation signal for maintaining a constant crystal frequency;

oscillating means coupled to said reference frequency crystal for providing said output signal.

6. The oscillator of claim 5, wherein said temperature compensation circuit includes a temperature sensor and said inflection point characterization signal varies the current through said temperature sensor.

7. The oscillator of claim 5, wherein said reference frequency crystal comprises a AT-cut crystal.

8. The oscillator of claim 5, wherein said frequency compensation means comprises a varactor.

9. A radio, comprising:

a receiver circuit;

a local oscillator circuit for generating local oscillator signals including a reference oscillator comprising:

a reference frequency crystal;

a temperature compensation circuit being responsive to at least one characterization signal for generating a corresponding compensation signal which varies with temperature and includes an inflection point which occurs at an inflection point temperature; and means responsive to an inflection point characterization signal for varying the temperature at which said inflection point of said compensation signal occurs;

a frequency compensation means coupled to said temperature compensation signal for maintaining a constant crystal frequency;

oscillating means coupled to said reference frequency crystal for providing said output signal.

10. The radio of claim 9, wherein said temperature compensation circuit includes a temperature sensor and said inflection point characterization signal varies the current through said temperature sensor.

11. The radio of claim 9, wherein said reference frequency crystal comprises a AT-cut crystal.

12. The radio of claim 9, wherein said frequency compensation means comprises a varactor.

* * * * *